United States Patent
Senga

(10) Patent No.: US 7,319,474 B2
(45) Date of Patent: Jan. 15, 2008

(54) ELECTRONICS APPARATUS AND IMAGE FORMING APPARATUS

(75) Inventor: Shotaro Senga, Daito (JP)

(73) Assignee: Funai Electric Co., Ltd., Daito-shi (JP)

( * ) Notice: Subject to any disclaimer, the term of this patent is extended or adjusted under 35 U.S.C. 154(b) by 0 days.

(21) Appl. No.: 10/954,367

(22) Filed: Oct. 1, 2004

(65) Prior Publication Data

US 2005/0105270 A1    May 19, 2005

(30) Foreign Application Priority Data

Oct. 3, 2003    (JP) ............................. 2003-345878

(51) Int. Cl.
B41J 2/375    (2006.01)
H05K 7/20    (2006.01)

(52) U.S. Cl. ...................... 347/223; 361/695; 361/697; 174/16.3

(58) Field of Classification Search ................ 361/695; 347/223
See application file for complete search history.

(56) References Cited

U.S. PATENT DOCUMENTS

| | | | | |
|---|---|---|---|---|
| 4,202,618 A | * | 5/1980 | Waschk et al. | 399/93 |
| 4,819,011 A | * | 4/1989 | Yokota | 347/223 |
| 5,053,792 A | * | 10/1991 | Une | 346/146 |
| 5,237,338 A | * | 8/1993 | Stephenson | 347/223 |
| 5,293,183 A | * | 3/1994 | Kim | 346/146 |
| 6,084,622 A | * | 7/2000 | Sugiura et al. | 347/170 |
| 6,093,961 A | * | 7/2000 | McCullough | 257/718 |
| 6,278,472 B1 | | 8/2001 | Sasaki et al. | |

FOREIGN PATENT DOCUMENTS

| | | | |
|---|---|---|---|
| JP | 04366653 | * | 12/1992 |
| JP | 04366676 | * | 12/1992 |
| JP | 7-129061 | | 5/1995 |
| JP | 10-235910 | | 9/1998 |
| JP | 2000-294705 | | 10/2000 |
| JP | 2002-321426 | | 11/2002 |

OTHER PUBLICATIONS

Office Action for Japanese Patent Application No. 2003-345878 dated Aug. 17, 2005.
Office Action for Japanese Patent Application No. 2003-345878 dated Jan. 25, 2006.

* cited by examiner

Primary Examiner—Jayprakash Gandhi
Assistant Examiner—Zachary Pape
(74) Attorney, Agent, or Firm—Crowell & Moring LLP

(57) ABSTRACT

In an image forming apparatus including a thermal head attached to a supporting body having a heat release function, a power supply circuit board that is disposed inside a casing and supplies electrical power to the thermal head, and a cooling fan that takes in the outside air for cooling the thermal head and the power supply circuit board, on the substrate of the power supply circuit board near the cooling fan provided on the side wall of the casing, a pair of heat sinks that guide cooling air from the cooling fan to the thermal head are implanted opposite each other by being spaced from the thermal head.

9 Claims, 2 Drawing Sheets

ELECTRONICS APPARATUS AND IMAGE FORMING APPARATUS

BACKGROUND OF THE INVENTION

1. Field of the Invention

The present invention relates to an electronics apparatus such as an image forming apparatus that is a heat transfer printer having a heat source, for example, a thermal head including a heat generating part that generates heat when it is operated, wherein, in particular, the heat source and heat generating parts forming a power supply circuit board that supplies electrical power to the heat source can be effectively cooled by a simple structure.

2. Description of the Related Art

As generally known, in electronics apparatuses such as heat transfer printers as image forming apparatuses, electronic parts including a thermal head, a power supply transformer that forms a power supply circuit board for supplying electrical power to the thermal head, a voltage control element such as an electrical field-effect transistor (hereinafter, simply abbreviated as FET), and a coil are known as heat generating parts that generate heat when operating, and it is necessary to effectively cool these.

In consideration of the abovementioned circumstances, conventionally, a structure disclosed (for example, refer to JP-A-2002-321426) in which cooling air is blown by a cooling fan to a cooling chamber having a heat sink provided on the back surface of the thermal head, and a slight amount of cooling air is blown to a fixing part via a tube from the cooling chamber.

However, in the construction described in JP-A-2002-321426 given above, most of the cooling air from the cooling fan is consumed for cooling of only the thermal head and then exhausted to the outside, and the fixing part is cooled only by a slight amount of cooling air, and the power supply circuit board that has heat generating parts necessary for supply of the electrical power is not cooled at all.

As a countermeasure for this, in the construction of JP-A-2002-321426 given above, for cooling the power supply circuit board, it is necessary that another cooling fan is provided, and this increases components and results in an increase in cost and an increase in size, etc.

SUMMARY OF THE INVENTION

The present invention has been made to solve the abovementioned problems, and an object thereof is to provide an electronics apparatus and an image forming apparatus in which heat sources formed of heat generating parts that generate heat when operating and a power supply circuit board that supplies electrical power to the heat sources can be very easily and effectively cooled without providing another cooling fan and increasing the capacity of the existing cooling fan.

In order to achieve this object, according to a first aspect of the invention, in an image forming apparatus including a thermal head that is attached to a supporting body having a heat release function, a power supply circuit board that is disposed inside a casing and supplies electrical power to the thermal head, and a cooling fan that takes in the outside air for cooling the thermal head and the power supply circuit board, on the substrate of the power supply circuit board near the cooling fan provided on the side wall of the casing, a pair of heat sinks that guide cooling air from the cooling fan to the thermal head are implanted opposite each other by being spaced from the thermal head.

According to a second aspect of the invention, in an electronics apparatus including a heat source formed of heat generating parts that generate heat when operating, a power supply circuit board that is disposed inside a casing and supplies electrical power to the heat sources, and a cooling fan that takes in the outside air for cooling the heat sources and the power supply circuit board, on the substrate of the power supply circuit board near the cooling fan provided on the side wall of the casing, a pair of heat sinks that guide the cooling air from the cooling fan to the heat sources are implanted opposite each other by being spaced from the thermal head.

According to a third aspect of the invention, at least one of the heat generating parts included in a part of electronic parts forming the power supply circuit board are attached to the heat sinks.

According to a fourth aspect of the invention, at least one of the heat generating parts included in a part of electronic parts forming the power supply circuit board are attached to the heat sinks.

According to a fifth aspect of the invention, the heat sources formed of heat generating parts that generate heat when operating are attached to a supporting body having a heat release function.

According to a sixth aspect of the invention, a voltage control element is attached to the heat sinks.

According to the first aspect of the invention, by the pair of heat sinks implanted opposite each other on the substrate of the power supply circuit board near the cooling fan, cooling air from the cooling fan is guided to the thermal head, and the thermal head is effectively cooled. Furthermore, the cooling air circulates evenly inside the power supply circuit board, and in conjunction with the radiation effect of the heat sinks that are cooled by this cooling air, the electronic parts forming the power supply circuit board are also cooled.

According to the second aspect of the invention, by the pair of heat sinks implanted opposite each other on the substrate of the power supply circuit board near the cooling fan, cooling air from the cooling fan is guided to the heat sources formed of heat generating parts that generate heat when operating, whereby the heat sources are effectively cooled. Furthermore, the cooling air circulates evenly inside the power supply circuit board, and in conjunction with the radiation effect of the heat sinks that are cooled by the cooling air, the electronic parts forming the power supply circuit are also cooled.

According to the third aspect of the invention, at least one of the heat generating parts included in the electronic parts forming the power supply circuit board attached to the heat sinks are effectively heat-released via the heat sinks, and this is preferable.

According to the fourth aspect of the invention, as in the case of the third aspect of the invention described above, at least one of the heat generating parts included in the electronic parts forming the power supply circuit board attached to the heat sinks are effectively heat-released via the heat sinks, and this is preferable.

According to the fifth aspect of the invention, heat sources formed of heat generating parts that generate heat when operating are attached to a supporting body having a heat release function, so that the heat sources are very effectively heat-released, and the cooling effect is improved.

According to the sixth aspect of the invention, the voltage control element attached to the heat sinks is effectively cooled via the heat sinks, and this is preferable.

BRIEF DESCRIPTION OF THE DRAWINGS

These and other objects and advantages of this invention will become more fully apparent from the following detailed description taken with the accompanying drawings in which.

DETAILED DESCRIPTION OF THE PREFERRED EMBODIMENTS

In an image forming apparatus including a thermal head attached to a supporting body having a heat release function, a power supply circuit board that is disposed inside a casing and supplies electrical power to the thermal head, and a cooling fan that takes in the outside air for cooling the thermal head and the power supply circuit board, on the substrate of the power supply circuit board near the cooling fan provided on the side wall of the casing, a pair of heat sinks that guide cooling air from the cooling fan to the thermal head are implanted opposite each other by being spaced from the thermal head, and a voltage control element is attached to the heat sinks.

Figure 1:
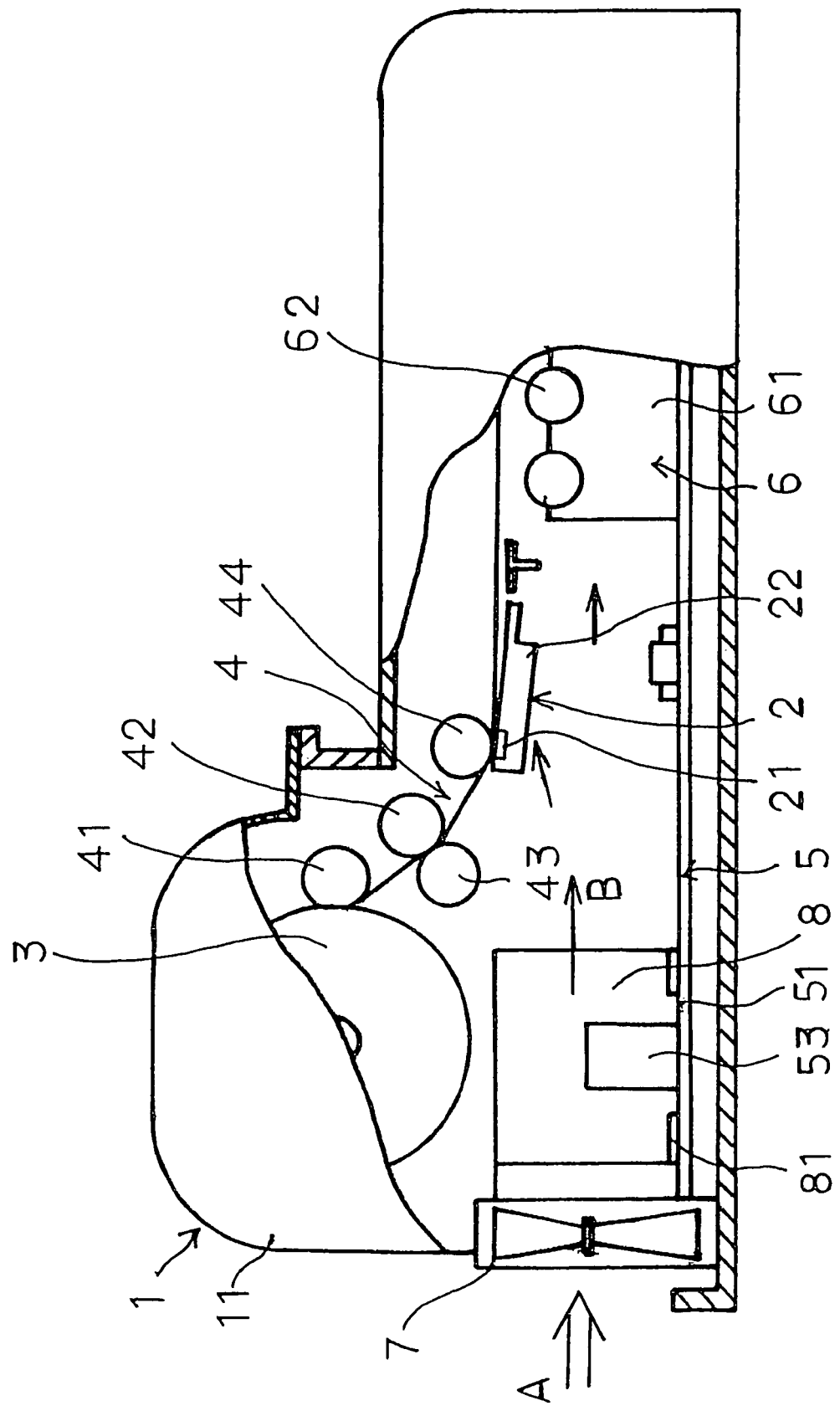
FIG. 1 is a schematic partially sectional construction view showing the main part of the image forming apparatus as an electronics apparatus according to an embodiment of the invention.
Figure 2:
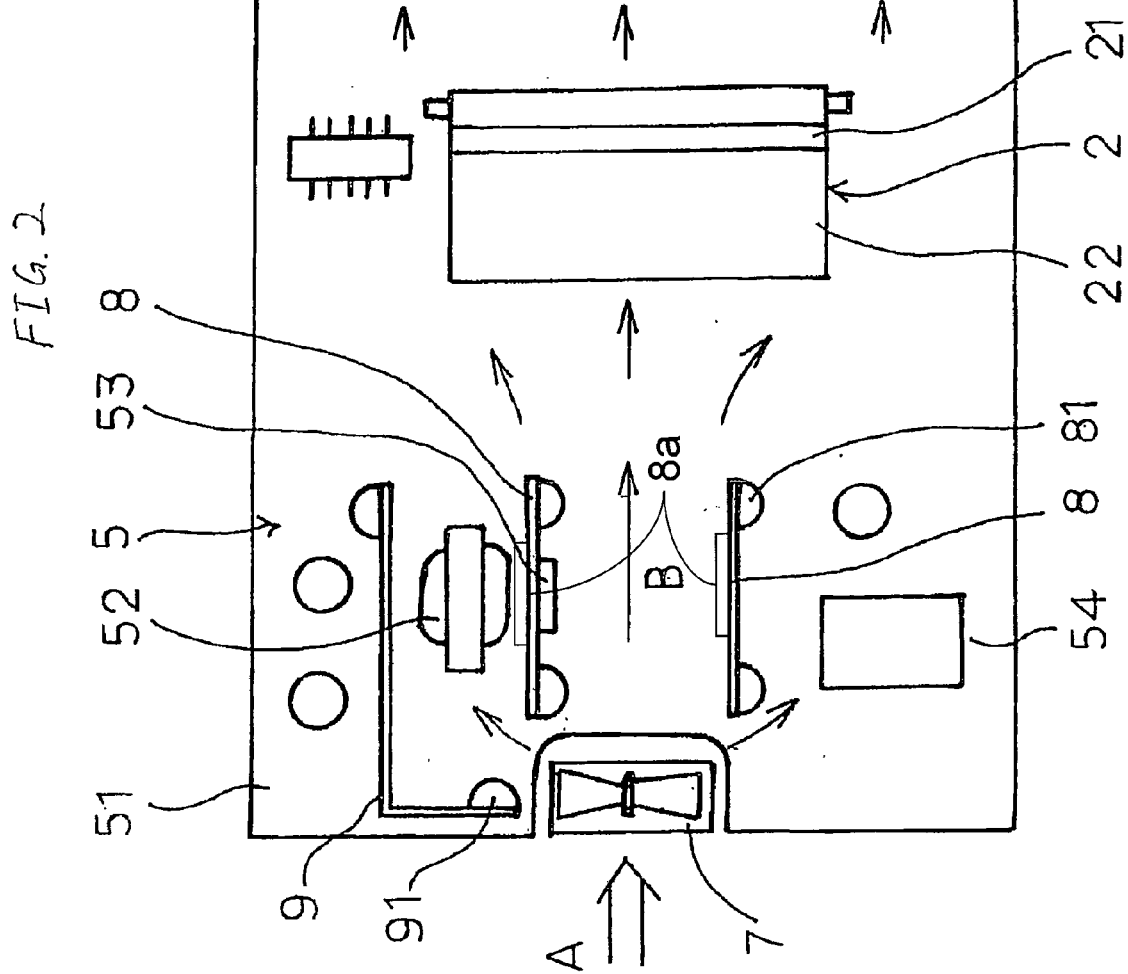
FIG. 2 is a schematic construction plan view showing the vicinity of the power supply circuit board, the cooling fan, and the thermal head of the image forming apparatus of FIG. 1.

Hereinafter, an embodiment of the invention is described with reference to FIG. 1 and FIG. 2. FIG. 1 is a schematic partially sectional construction view showing a main part of an image forming apparatus as an electronics apparatus according to an embodiment of the invention, and FIG. 2 is a schematic construction plan view showing the vicinity of the power supply circuit board, the cooling fan, and the thermal head of the image forming apparatus of FIG. 1.

The reference numeral 1 denotes an image forming apparatus as a heat transfer printer including a heat source, for example, a thermal head 2 formed of a heat generating part that generates heat when operating, which prints a predetermined image by the thermal head 2 onto a heat-sensitive paper 3 in response to an instruction from a control part that is not shown. The conveyance path 4 for conveying the heat-sensitive paper 3 is formed by a paper feed roller 41, a capstan roller 42, a nip roller 43, a platen roller 44, etc. The power supply circuit board 5 is disposed inside a casing 11, which is formed by mounting a power supply transformer 52, an FET 53, a coil 54, and in addition, a transistor, a capacitor, and a resistor, etc., on the substrate 51, and supplies electrical power mainly to the thermal head 2, a fixing part 6, and a cooling fan 7 described later. The power supply transformer 52 and the FET 53, etc., forming the power supply circuit board 5 involve heat generation when operating, so that it is preferable that they are cooled.

The fixing part 6 is formed by attaching ultraviolet ray lamps 62 and a reflecting plate that is not shown to a supporting frame 61 mounted on the substrate 51, and is controlled by a control part that is not shown to selectively light the ultraviolet ray lamp 62 to irradiate the heat-sensitive paper 3 moving in the conveyance path 4 with an ultraviolet ray for fixation. This fixing part 6 also generates heat due to lighting, so that it is preferable that the fixing part is cooled. Furthermore, the cooling fan 7 is provided on the side wall of the casing 11, and is constructed so as to take-in the outside air as shown by the arrow A for cooling the thermal head 2 and the power supply circuit board 5 as heat sources formed of heat generating parts that generate heat when operating, that is, electronic parts including the power supply transformer 52, the FET 53, the coil 54, and in addition, the transistor, the capacitor, and the resistor, etc., forming the power supply circuit board 5.

According to the invention, on the substrate 51 of the power supply circuit board 5 near the cooling fan 7, a pair of heat sinks 8 and 8 that guide the cooling air from the cooling fan 7 to the thermal head 2 are implanted opposite each other by being spaced from the thermal head 2. The heat sinks 8 are made of a material such as aluminum that is excellent in heat transfer and easily machined, and it is as a matter of course that the heat sinks 8 may be provided with fins 8a accordingly. The reference numeral 81 denotes an attaching portion of the heat sinks 8, and is attached to the substrate 51 so as to be implanted on the substrate 51 by using bolts and nuts.

The thermal head 2 is formed by arranging a number of heat generating elements 21 in line in the width direction of the heat-sensitive paper 3, and is attached to a supporting body 22 made of aluminum having a heat release function on its back surface. Therefore, this is preferable since, when printing an image, heat generated at the thermal head 2 is transferred to the supporting body 22 and the heat can be released from this supporting body 22.

Other heat generating parts included in a part of the electronic parts forming the power supply circuit 2, for example, the FET 53 is attached to the heat sinks 8 so that a part of the surface is in close contact with the inner surface side of the heat sinks 8, whereby the attached FET 53 can be effectively cooled, and this is preferable.

In the figures, the reference numeral 9 denotes a heat sink that is made of aluminum and provided accordingly, and this heat sink 9 receives heat radiated from the power supply transformer 52 and releases the heat, and shields other electronic parts so that they are not directly influenced by the heat. The reference numeral 91 denotes the attaching portion of this heat sink 9, which is attached to the substrate 51 by using bolts and nuts.

In the embodiment constructed as described above, when the image forming apparatus 1 of this type of heat transfer printer is operated and the thermal head 2 generates heat, by the pair of heat sinks 8 and 8 implanted opposite each other on the substrate 51 of the power supply circuit board 5 near the cooling fan 7, cooling air taken in from the outside by the cooling fan 7 is guided to the thermal head 2 as shown by the arrow B, and the thermal head 2 is effectively cooled. Furthermore, between the heat sinks 8 and the thermal head 2, an appropriate space is created, so that the cooling air circulates evenly as shown by the arrow C inside the power supply circuit board 5, and in conjunction with the heat radiation action of the heat sinks 8 that are cooled by the cooling air, electronic parts including the power supply transformer 52, the FET 53, the coil 54, the transistor, the capacitor, and the resistor, etc., forming the power supply circuit board 2, in addition, the fixing part 6 are effectively cooled. Therefore, it is not necessary that the capacity of the cooling fan 7 is especially increased, and at a low cost, this type of apparatus can be prevented from increasing in size and noise.

The abovementioned embodiment is a preferable embodiment of the invention, and the invention is not limited to this, and within a scope without deviating from the spirit of the invention, various modifications can be carried out.

What is claimed is:

1. An image forming apparatus comprising:
   a thermal head attached to a supporting body that has a heat release function;
   a power supply circuit board that is disposed inside a casing and supplies electrical power to the thermal head; and
   a cooling fan which takes in the outside air for cooling the thermal head and the power supply circuit board, wherein
   on a substrate of the power supply circuit board near the cooling fan provided on a side wall of the casing, a pair of heat sinks that guide cooling air from the cooling fan to the thermal head are implanted opposite each other by being spaced from the thermal head,
   at least one of the electronic parts forming the power supply circuit board is attached to the heat sinks, the at least one of the electronic parts attached to the heat sink is a voltage control element.

2. The image forming apparatus according to claim 1, wherein each of the pair of heat sinks includes fins.

3. The image forming apparatus of claim 1, further comprising:
   a power supply transformer; and
   a third heat sink, wherein the power supply transformer is arranged between one of the pair of heat sinks and the third heat sink.

4. An electronics apparatus comprising:
   a heat source formed of heat generating parts that generate heat when operating;
   a power supply circuit board that is disposed inside a casing and supplies electrical power to the heat source; and
   a cooling fan that takes in the outside air for cooling the heat sources and the power supply circuit board, wherein
   on the substrate of the power supply circuit board near the cooling fan provided on the side wall of the casing, a pair of heat sinks that guide cooling air from the cooling fan to the heat sources are implanted opposite each other by being spaced from the heat source, and
   wherein a voltage controlled element is attached to one of the pair of heat sinks.

5. The electronics apparatus according to claim 4, wherein each of the pair of heat sinks includes fins.

6. An image forming apparatus comprising:
   a cooing fan;
   a thermal head that generates heat;
   first and second heat sinks arranged in an air flow path between the cooling fan and the thermal head, wherein the first and second heat sinks are spaced apart from each other and from the thermal head; and
   a heat generating device arranged on one of the first and second heat sinks,
   wherein the heat generating device is a voltage control element.

7. An image forming apparatus comprising:
   a cooling fan;
   a thermal head generates heat;
   first and second heat sinks arranged in an air flow path between the cooling fan and the thermal head, wherein the first and second heat sinks are spaced apart from each other and from the thermal head;
   a third heat sink; and
   a power supply transformer arranged between the third heat sink and one of the first and second heat sinks.

8. An image forming apparatus comprising:
   a cooling fan:
   a thermal head that generates heat;
   first and second heat sinks arranged in an air flow path between the cooling fan and the thermal head, wherein the first and second heat sinks are spaced apart from each other and from the thermal head;
   a power supply circuit board, wherein the first and second heat sinks are arranged on the power supply circuit board; and
   a voltage controlled element attached to one of the first and second heat sinks.

9. The image forming apparatus of claim 8, further comprising:
   a third heat sink; and
   a power supply transformer arranged between the third heat sink and one of the first and second heat sinks.

* * * * *